United States Patent
Chen et al.

(10) Patent No.: US 11,165,249 B2
(45) Date of Patent: Nov. 2, 2021

(54) SIGNAL SWITCHING APPARATUS

(71) Applicant: RichWave Technology Corp., Taipei (TW)

(72) Inventors: Chih-Sheng Chen, Taipei (CN); Tsung-Han Lee, Taipei (CN); Chuan-Chen Chao, Taipei (CN)

(73) Assignee: RichWave Technology Corp., Taipei (TW)

( * ) Notice: Subject to any disclaimer, the term of this patent is extended or adjusted under 35 U.S.C. 154(b) by 179 days.

(21) Appl. No.: 16/515,015

(22) Filed: Jul. 17, 2019

(65) Prior Publication Data

US 2020/0028357 A1 Jan. 23, 2020

(30) Foreign Application Priority Data

Jul. 20, 2018 (TW) .................................. 107125264

(51) Int. Cl.
*H02H 9/04* (2006.01)
*H02M 7/48* (2007.01)
*H05K 1/02* (2006.01)
*H03K 17/693* (2006.01)

(52) U.S. Cl.
CPC .............. *H02H 9/046* (2013.01); *H02M 7/48* (2013.01); *H03K 17/693* (2013.01); *H05K 1/0259* (2013.01)

(58) Field of Classification Search
CPC ......... H02H 9/046; H02H 9/025; H02M 7/48; H03K 17/693; H03K 17/081; H05K 1/0259; G05F 3/185; H04B 3/46
See application file for complete search history.

(56) References Cited

U.S. PATENT DOCUMENTS

| | | | |
|---|---|---|---|
| 4,631,470 A | 12/1986 | Bingley | |
| 5,856,904 A | 1/1999 | Pelly et al. | |
| 2003/0117206 A1* | 6/2003 | Ohnakado | H01L 27/0251 327/310 |
| 2004/0211677 A1 | 10/2004 | Lewis | |
| 2006/0184558 A1* | 8/2006 | Martin | H04N 21/4825 |

(Continued)

FOREIGN PATENT DOCUMENTS

| | | |
|---|---|---|
| EP | 2412208 | 8/2013 |
| TW | 477114 | 2/2002 |
| TW | 201528684 | 7/2015 |

*Primary Examiner* — Rafael O De Leon Domenech
(74) *Attorney, Agent, or Firm* — JCIPRNET

(57) ABSTRACT

A signal switching apparatus includes a signal control switch, a switch circuit, a blocking capacitor and a surge current dissipating circuit. The signal control switch coupled between a first signal transceiving end and a second signal transceiving end is turned on or turned off according to a first control signal. The switch circuit having at least one first transistor is controlled by a second control signal to be turned on or off, and a first end of the switch circuit is coupled to the first signal transceiving end. The blocking capacitor is coupled between a second end of the switch circuit and a reference voltage terminal. The surge current dissipating circuit having at least one second transistor is coupled between the second end of the switch circuit and the reference voltage terminal. The second transistor is configured to dissipate a surge current and also turned off when operated normally.

15 Claims, 6 Drawing Sheets

(56) References Cited

U.S. PATENT DOCUMENTS

| | | | |
|---|---|---|---|
| 2010/0225378 A1* | 9/2010 | Nakatsuka | H03K 17/04123 |
| | | | 327/434 |
| 2012/0212192 A1 | 8/2012 | Peto | |
| 2016/0156178 A1* | 6/2016 | Yamamoto | H01L 27/0255 |
| | | | 361/16 |
| 2017/0278840 A1* | 9/2017 | Robbins | H01L 27/0288 |
| 2019/0140687 A1* | 5/2019 | Tombak | H01P 1/15 |
| 2019/0305768 A1* | 10/2019 | Willard | H01L 25/0657 |

* cited by examiner

SIGNAL SWITCHING APPARATUS

CROSS REFERENCE TO RELATED APPLICATION

This application claims the priority benefit of Taiwan application Ser. No. 107125264, filed on Jul. 20, 2018. The entirety of the above-mentioned patent application is hereby incorporated by reference herein and made a part of specification.

BACKGROUND

Technical Field

The disclosure is related to a signal switching apparatus, and particularly to a signal switching apparatus that effectively dissipates surge current when surge current is generated.

Description of Related Art

In conventional technical field, signal switching apparatus may be provided with a corresponding shunt circuit on a signal transceiving end. When the signal transceiving end performs a signal transceiving operation, the corresponding shunt circuit is turned off. Relatively, when the signal transceiving end does not perform the signal transceiving operation, the corresponding shunt circuit is turned on to avoid the signal being erroneously transmitted to the signal transceiving end that does not perform operation.

It should be indicated that, when a surge (e.g., Electrostatic Discharge (ESD) or Electrical Overstress (EOS)) occurs on the conventional signal switching apparatus, in order to prevent the electronic element in the signal switching apparatus from being damaged, it is required to provide a surge current protection preventing a venting action of the surge current. However, the conventional surge current protection element usually requires a large circuit area, and the parasitic effect generated thereby causes the quality of high-frequency signal that is transmitted by the signal switching apparatus to decrease, which causes negative effect on the cost and performance of product.

SUMMARY

The disclosure provides a signal switching apparatus, capable of effectively dissipating surge current when surge current is generated.

A signal switching apparatus of the disclosure includes a first signal control switch, a first switch circuit, a first blocking capacitor and a first surge current dissipation circuit (SCD-circuit). The first signal control switch coupled between a first signal transceiving end and a second signal transceiving end is turned on or off according to a first control signal. The first switch circuit has at least one first transistor. A first end of the first switch circuit is coupled between the first signal transceiving end and the first signal control switch. The first switch circuit is controlled by a second control signal to be turned on or off. The first blocking capacitor is coupled between a second end of the first switch circuit and a reference voltage terminal. The first SCD-circuit has at least one second transistor. The first surge current dissipating circuit is coupled between the second end of the first switch circuit and the reference voltage terminal. The at least one second transistor dissipates the surge current when the surge current is generated, and is turned off according to a first bias voltage when the signal switching apparatus is operated normally.

Another signal switching apparatus of the disclosure includes a first signal control switch, a first switch circuit, a first blocking capacitor, a second blocking capacitor and a first SCD-circuit. The first signal control switch coupled between a first signal transceiving end and a second signal transceiving end is turned on or off according to a first control signal. The first switch circuit has at least one first transistor. A first end of the first switch circuit is coupled between the first signal transceiving end and a first signal control switch. The first switch circuit is controlled by a second control signal to be turned on or off. The first blocking capacitor and the first signal control switch are coupled in series between the first signal transceiving end and the second signal transceiving end, such that the first signal control switch is coupled to one of the first signal transceiving end and the second signal transceiving end through the first blocking capacitor. A second blocking capacitor is coupled between the second end of the first switch circuit and the reference voltage terminal. The first SCD-circuit has at least one second transistor. The first SCD-circuit has a first end and a second end respectively coupled to a first end and a second end of the first blocking capacitor. The second transistor dissipates the surge current when the surge current is generated. The second transistor is off according to a first bias voltage when the signal switching apparatus is operated normally.

Another signal switching apparatus of the disclosure includes a first signal control switch, a first switch circuit, a first blocking capacitor, a first SCD-circuit, a second signal control switch, a second switch circuit, a second blocking capacitor and a second SCD-circuit. The first signal control switch coupled between a first signal transceiving end and a second signal transceiving end is turned on or off according to a first control signal. The first switch circuit has at least one first transistor. A first end of the first switch circuit is coupled between the first signal transceiving end and the first signal control switch. The first switch circuit is controlled by a second control signal to be turned on or off. The first blocking capacitor is coupled between a second end of the first switch circuit and a reference voltage terminal. The first SCD-circuit has at least one second transistor. The first SCD-circuit is coupled between a second end of the first switch circuit and the reference voltage terminal. The at least one second transistor dissipates surge current when the surge current is generated and is off according to a first bias voltage when the signal switching apparatus is operated normally. The second signal control switch coupled between a third signal transceiving end and the second signal transceiving end is controlled by a third control signal to be turned on or off. The second switch circuit has at least one third transistor. A first end of the second switch circuit is coupled between the third signal transceiving end and the second signal control switch. The second switch circuit is controlled by a fourth control signal to be turned on or off. The second blocking capacitor is coupled between the second end of the second switch circuit and the reference voltage terminal. The second SCD-circuit has at least one fourth transistor. The second SCD-circuit is coupled between the second end of the second switch circuit and the reference voltage terminal. The at least one fourth transistor dissipates surge current when the surge current is generated and is turned off according to a second bias voltage when the signal switching apparatus is operated normally.

DESCRIPTION OF THE EMBODIMENTS

Figure 1:
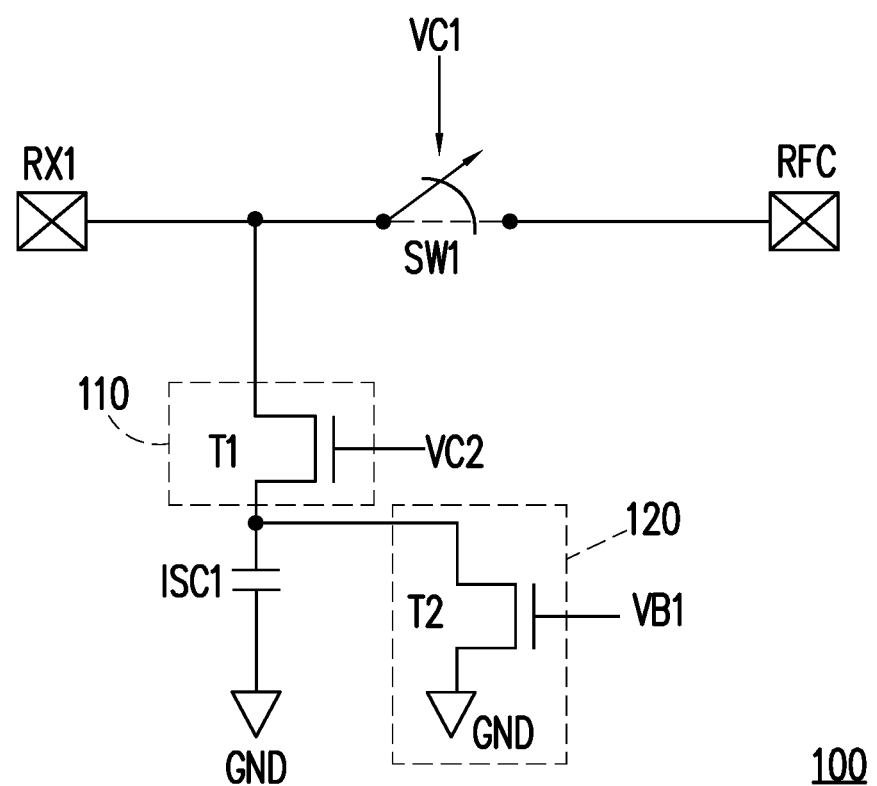
FIG. 1 is a schematic view of a signal switching apparatus according to an embodiment of the disclosure.

Referring to FIG. 1, a schematic view of a signal switching apparatus according to an embodiment of the disclosure. A signal switching apparatus 100 includes a switch SW1, a switch circuit 110, a blocking capacitor ISC1 and a surge current dissipation circuit (SCD-circuit) 120. The switch SW1 is coupled between a signal transceiving end RX1 and a signal transceiving end RFC. The switch SW1 is controlled by a control signal VC1 to be turned on or off. A first end of the switch circuit 110 is coupled between the signal transceiving end RX1 and the switch SW1. The second end of the switch circuit 110 is coupled to the first end of the blocking capacitor ISC1. The switch circuit 110 is controlled by a control signal VC2 to be turned on or off. In the embodiment, the switch circuit 110 has at least one transistor T1, wherein a first end of the transistor T1 is coupled between the signal transceiving end RX1 and the switch SW1, a second end of the transistor T1 is coupled to the first end of the blocking capacitor ISC1, and the control end of the transistor T1 receives the control signal VC2. The transistor T1 is turned on or off according to the control signal VC2. In another embodiment, the switch circuit 110 may have a plurality of transistors T1 connected in series between the signal transceiving end RX1 and the blocking capacitor ISC1. The control end of the plurality of first transistors receive the control signal VC2 together.

In the embodiment, the signal transceiving ends RX1 and RFC may be configured to receive or transmit radio frequency (RF) signal.

The switch circuit 110 and the blocking capacitor ISC1 are configured to form a shunt path. The first end of the blocking capacitor ISC1 is coupled to the second end of the switch circuit 110, and the second end of the blocking capacitor ISC1 is coupled to a voltage terminal GND. In the embodiment, the voltage terminal GND may provide a ground voltage or a common voltage. Further, the SCD-circuit 120 has a first end and a second end, the first end thereof is coupled between the first end of the blocking capacitor ISC1 and the second end of the switch circuit 110, the second thereof is coupled to the voltage terminal GND. The SCD-circuit 120 has at least one transistor T2, wherein the first end of the transistor T2 is coupled to the first end of the SCD-circuit 120, the second end of the transistor T2 is coupled to the second end of the SCD-circuit 120, and the control end of the transistor T2 receives a bias voltage VB1. In other words, the SCD-circuit 120 and the transistor T2 thereof may be coupled to the blocking capacitor ISC1 in parallel. It should be pointed out that, when the signal switching apparatus 100 is operated normally, the transistor T2 may continuously receive the bias voltage VB1 and is maintained in a turn-off state according to the bias voltage VB1. In another embodiment, the SCD-circuit 120 may have a plurality of transistors T2 connected in series, collectively receive the bias voltage VB1 and are maintained in a turn-off state according to the bias voltage VB1. In one embodiment, when the signal switching apparatus 100 is operated normally, the surge current is not generated on the signal switching apparatus 100.

Regarding details of operation of the signal switching apparatus 100, when a signal is to be transmitted or received between the ends RX1 and RFC, the switch SW1 may be turned on according to the control signal VC1. In this manner, the signal can be transmitted between the ends RX1 and RFC. Meanwhile, the transistor T1 in the switch circuit 110 can be turned off according to the control signal VC2, thereby reducing loss of energy caused by leakage of signal to the voltage terminal GND. Relatively, when the signal transceiving operation is not performed between the ends RX1 and RFC, the switch SW1 may be turned off according to the control signal VC1. In this manner, it is possible to avoid signal transmission between the signal ends RX1 and RFC. At the same time, the transistor T1 in the switch circuit 110 may be turned on according to the control signal VC2, and is configured to shunt the signal that is leaked to the end RX1 through a turn-off capacitor (Coff) of the switch SW1, thereby it is possible to avoid the signal being transmitted to the end RX1. In other words, when the signal switching apparatus 100 is operated normally, the on or off states of the transistor T1 and the switch SW1 are opposite. Herein, the turn-off capacitor refers to a parasitic capacitor of the switch SW1 when being turned off.

On the other hand, when the signal switching apparatus 100 is operated normally, the turn-off transistor T2 is maintained through the SCD-circuit 120, and the effect of the SCD-circuit 120 on the quality of the transmitted RF signal is reduced.

It should be noted that, when the surge current is generated on the signal switching apparatus 100 (non-normal operation), the transistor T2 in the SCD-circuit 120 may be configured to dissipate the surge current, and prevents the circuit element in the signal switching apparatus 100 as well as the circuit element that is connected to the signal switching apparatus 100 from being damaged by the surge current. In the embodiment, the transistor T2 may be turned on at the moment that the surge current is occurred and dissipates the surge current through providing a channel. Specifically, the transistor T2 may perform the dissipating operation on the surge current by dissipating the surge current to the voltage terminal GND.

Additionally, in another embodiment of the disclosure, the switch circuit 110 further includes a capacitor coupled between the first end of the transistor T1 and the control end VC2 and allowing more surge current to pass through the transistor T1.

It should be mentioned that, in order to reduce process complexity, in the embodiment of the disclosure, the transistors T1 and T2 may be both enhancement transistors or depletion transistors. In another embodiment of the disclosure, the transistors T1 and T2 may be both n-type transistors or p-type transistors.

Figure 2A:
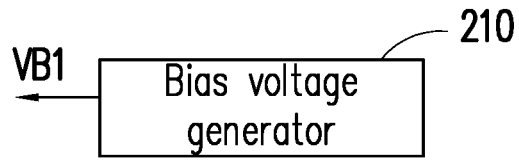
FIG. 2A is a schematic view of a bias voltage generating mechanism according to an embodiment of the disclosure.
Figure 2B:
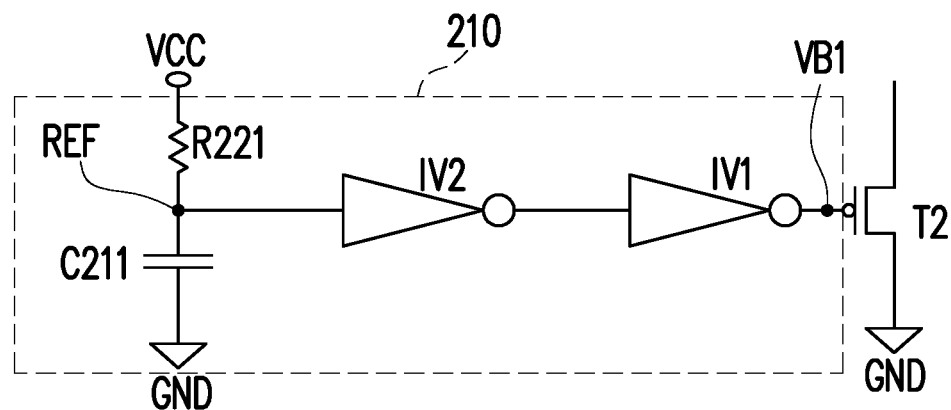
FIG. 2B-FIG. 2G are circuit diagrams showing implementation of a bias voltage generator according to an embodiment of the disclosure.

Referring to FIG. 1 and FIG. 2A, FIG. 2A is a schematic view of a bias voltage generating mechanism according to an embodiment of the disclosure. In the embodiment of the disclosure, the bias voltage VB1 received by the transistor T2 may be provided by a bias voltage generator 210. The implementation of the bias voltage generator 210 is described in the circuit diagram showing implementation of the bias voltage generator shown in FIG. 2B-FIG. 2G. In FIG. 2B, the bias voltage generator 210 includes two inverters IV1 and IV2 connected in series and a delay circuit constituted by a resistor R221 and a capacitor C221. The inverters IV1 and IV2 are connected between the control end of the transistor T2 and an inner node REF in series. An output end of the inverter IV1 provides the bias voltage VB1 and is coupled to the control end of the transistor T2. The input end of the inverter IV1 is coupled to the output end of the inverter IV2, and the input end of the inverter IV2 is coupled to the inner node REF. The resistor R221 and the capacitor C221 are connected in series between a reference voltage receiving end and the voltage terminal GND. The reference voltage receiving end is configured to receive a reference voltage VCC. The inner node REF is coupled between the resistor R221 and the capacitor C221 in the delay circuit. Additionally, one end of the resistor R221 receives the reference voltage VCC, another end of the resistor R221 is coupled to the inner node REF. The first end of the capacitor C221 is coupled to the inner node REF, the second end of the capacitor C221 is coupled to the voltage terminal GND. The delay circuit provides the reference voltage VCC to the inner node REF through the resistor R221. The inverters IV1 and IV2 generate bias voltage VB1 at high voltage level according to the input voltage. In the embodiment, the transistor T2 may be a p-type enhancement transistor. In the embodiment, the number of the inverter is even number, and the disclosure provides no limitation to the number of the inverter. When the signal switching apparatus 100 is operated normally, the bias voltage VB1 at high voltage level provided by the bias voltage generator 210 may be the same as the voltage level of the reference voltage VCC, such that the transistor T2 is maintained in the turn-off state. The enhancement transistor is, for example, an enhancement field effect transistor (E-FET), an enhancement pseudomorphic high electron mobility transistor (E-pHEMT) or an enhancement junction field effect transistor (E-JFET).

Figure 2C:
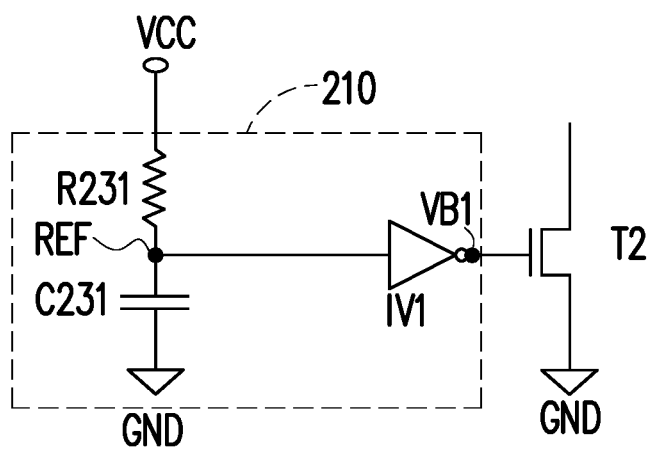

FIG. 2C is a circuit diagram showing implementation of a bias voltage generator according to another embodiment of the disclosure. A bias voltage generator 210 includes an inverter IV1 that generates bias voltage VB1 at the output end. The coupling method and operation principle of a resistor R231 and a capacitor C231 in the embodiment are similar to the resistor R221 and the capacitor C221 in FIG. 2B, and related descriptions are omitted hereinafter. The output end of the inverter IV1 in the embodiment provides the bias voltage VB1 at low voltage level and is coupled to the control end of the transistor T2. The input end of the inverter IV1 is coupled to the inner node REF. In the embodiment, the transistor T2 may be an n-type enhancement transistor. When the signal switching apparatus 100 is operated normally, the transistor T2 is maintained turned off. In the embodiment, the number of inverter is odd number, and the disclosure provides no limitation to the number of the inverter.

In the embodiments of FIG. 2B and FIG. 2C, when the reference voltage VCC is generated, the delay circuit may provide an input voltage to the inner node REF according to the reference voltage VCC. When the signal switching apparatus 100 is operated normally, and the reference voltage VCC is in a stable state, the delay circuit continuously provides the input voltage equal to the reference voltage VCC to the inverter IV1 or inverters IV1 and IV2, and makes the inverter IV1 generate the bias voltage VB1 that substantially allows the transistor T2 to be maintained turned off, thereby reducing the effect of the SCD-circuit 120 on the quality of the transmitted RF signal. When the surge current is generated, the delay circuit provides a low voltage level that is maintained for at least a certain period of time, and makes the inverter IV1 generate the bias voltage VB1 that substantially turns on the transistor T2. In this manner, the surge current may be dissipated through the transistor T2 that is turned on, thereby effectively protecting the circuit element from being easily damaged by the surge current.

Figure 2D:
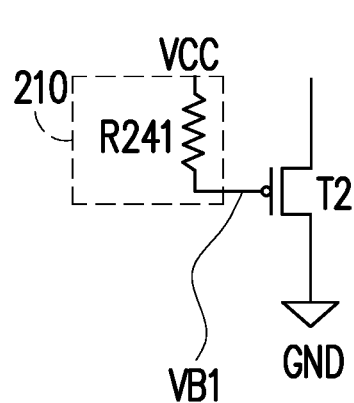

In FIG. 2D, the bias voltage generator 210 includes a resistor R241. One end of the resistor R241 is coupled to a reference voltage terminal to receive the reference voltage VCC, and another end thereof is coupled to the control end of the transistor T2, and provides the bias voltage VB1. In the embodiment, the transistor T2 may be a p-type enhancement transistor. When the signal switching apparatus 100 is operated normally, the resistor R241 provides the bias voltage VB1 that is equal to the reference voltage VCC, such that the transistor T2 is maintained turned off.

Figure 2E:
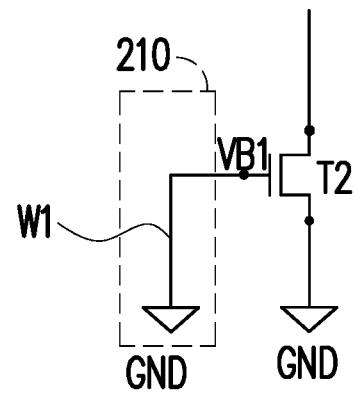

In FIG. 2E, the bias voltage generator 210 is constituted by a transmitting wire W1. The transmitting wire W1 is connected between the control end of the transistor T2 and the voltage terminal GND. When the signal switching apparatus 100 is operated normally, the bias voltage VB1 generated by the transmitting wire W1 is equal to the voltage on the voltage terminal GND, and provides the bias voltage VB1 to the control end of the transistor T2. In the embodiment, the transistor T2 may be an n-type enhancement transistor. In another embodiment, one end of the transmitting wire W1 may be connected to a reference voltage receiving end to receive the reference voltage VCC, and another end thereof is connected to the control end of the transistor T2. The transistor T2 may be a p-type enhancement transistor.

Figure 2F:
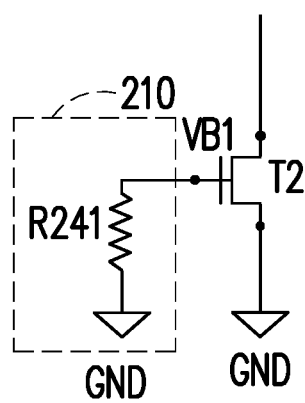

In FIG. 2F, the bias voltage generator 210 includes the resistor R241. One end of the resistor R241 generates the bias voltage VB1, and another end of the resistor R241 is coupled to the voltage terminal GND. The bias voltage VB1 generated by the resistor R241 is equal to the voltage on the voltage terminal GND, and provides the bias voltage VB1 to the control end of the transistor T2. In the embodiment, the transistor T2 may be an n-type enhancement transistor.

Figure 2G:
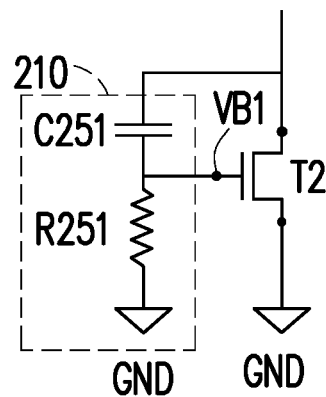

In FIG. 2G, the bias voltage generator 210 includes a capacitor C251 and a resistor R251. A first end of the capacitor C251 is coupled to the first end of the transistor T2, a second end of the capacitor C251 is coupled to the control end of the transistor T2 and the first end of the resistor R251. The second end of the resistor R251 is coupled to the voltage terminal GND and generates the bias voltage VB1. In the embodiment, the transistor T2 may be an n-type enhancement transistor.

In the embodiments of FIG. 2D to FIG. 2G, when the signal switching apparatus 100 is operated normally, through the reference voltage VCC or the voltage on the voltage terminal GND, the bias voltage generator 210 generates the bias voltage VB1 that substantially allows the transistor T2 to be maintained in turned off, thereby reducing the effect of the SCD-circuit 120 on the quality of the transmitted RF signal. When the surge current is generated, the surge current dissipating path of the transistor T2 is triggered to turn on, in this manner, the surge current may be dissipated through the surge current dissipating path of the transistor T2 that is turned on, thereby effectively protecting the circuit element from being easily damaged by the surge current.

Figure 3:
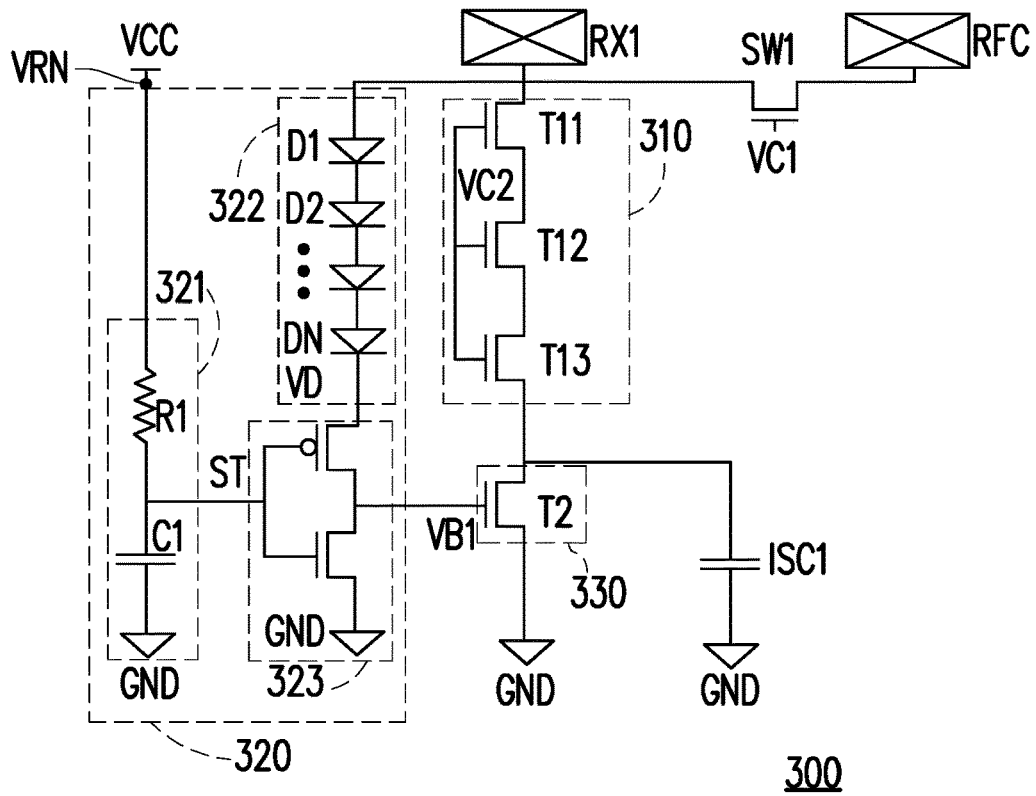
FIG. 3 is a schematic view of a signal switching apparatus according to another embodiment of the disclosure.

Referring to FIG. 3, FIG. 3 is a schematic view of a signal switching apparatus according to another embodiment of the disclosure. A signal switching apparatus 300 includes a switch SW1, a switch circuit 310, a blocking capacitor ISC1, a SCD-circuit 330 and a bias voltage generator 320. The coupling method and the operation principle of the switch SW1, the blocking capacitor ISC1 and the SCD-circuit 330 in the embodiment are respectively similar to the switch SW1, the blocking capacitor ISC1 and the SCD-circuit 120 in FIG. 1, and thus related descriptions are omitted hereinafter. In the embodiment, the switch circuit 310 includes a plurality of transistors T11-T13. The transistors T11-T13 are coupled in series between the end RX1 and the first end of the blocking capacitor ISC1. The control ends of the transistors T11-T13 are coupled together and receive the control signal VC2.

In the embodiment, the switch circuit 310 may include a plurality of transistors, and the number of the transistor in the switch circuit 310 may be set by the designer depending on actual requirements; the disclosure provides no limitation thereto.

Additionally, the bias voltage generator 320 includes a delay circuit 321, a turn-on voltage controller 322 and an inverter 323. The turn-on voltage controller 322 may include N diodes D1-DN connected in series, wherein an anode of the diode D1 is coupled to the end RX1, a cathode of the diode DN is coupled to a power end of the inverter 323, N is a positive integer that is larger than or equal to 1. In another embodiment, the anode of the diode D1 may be coupled to any end point on a serial connection path of the switch circuit 310, such as the first end or the second end of the switch circuit 310, or a first end or a second end of any transistor among the serially connected transistors T11-T13 in the switch circuit 310. Specifically, the turn-on voltage controller 322 detects the voltage on the end RX1, and is turned on when the voltage on the end RX1 is larger than the sum of the turn-on voltage of the diodes D1-DN, thereby providing voltage VD to the power end of the inverter 323. In the embodiment of the disclosure, the number N of the diodes D1-DN is determined by the designer depending on the operation requirement of the signal switching apparatus 300 to reduce loss of RF signal, and to maintain the turn-off bias voltage VB1 for the transistor T2, thereby reducing the effect of the SCD-circuit 120 on the quality of the transmitted RF signal.

The input end of the inverter 323 receives a signal ST generated by the delay circuit 321, an output end of the inverter 323 generates the bias voltage VB1 according to the signal ST. The delay circuit 321 includes a resistor R1 and a capacitor C1. The first end of the resistor R1 is coupled to the voltage receiving end VRN and configured to receive the reference voltage VCC. The second end of the resistor R1 is coupled to the first end of the capacitor C1, the second end of the capacitor C1 is coupled to the voltage terminal GND. Specifically, the inner node coupled to the resistor R1 and the capacitor C1 generates the signal ST.

It should be indicated that when the surge current is generated, the delay circuit provides a low voltage level that is maintained for at least a certain period of time to the inner node coupled to the resistor R1 and the capacitor C1, and makes the inverter 323 generate the bias voltage VB1 that substantially turns on the transistor T2. On this occasion, the level of the bias voltage VB1 is approximately equal to the level of an operation voltage VD at the power end of the inverter 323. In this manner, the surge current may be dissipated through the transistor T2 that is turned on, thereby effectively protecting the circuit element from being damaged by the surge current.

Relatively, in the state that the signal switching apparatus 300 is operated normally (no surge current is generated), the signal ST generated by the delay circuit 321 is substantially equal to the level of the reference voltage VCC, such that the inverter 323 generates the bias voltage VB1 that is substantially equal to the level of the voltage terminal GND. In this manner, the transistor T2 can be maintained turned off, thereby reducing the effect of the SCD-circuit 330 on the quality of the transmitted RF signal.

Figure 4:
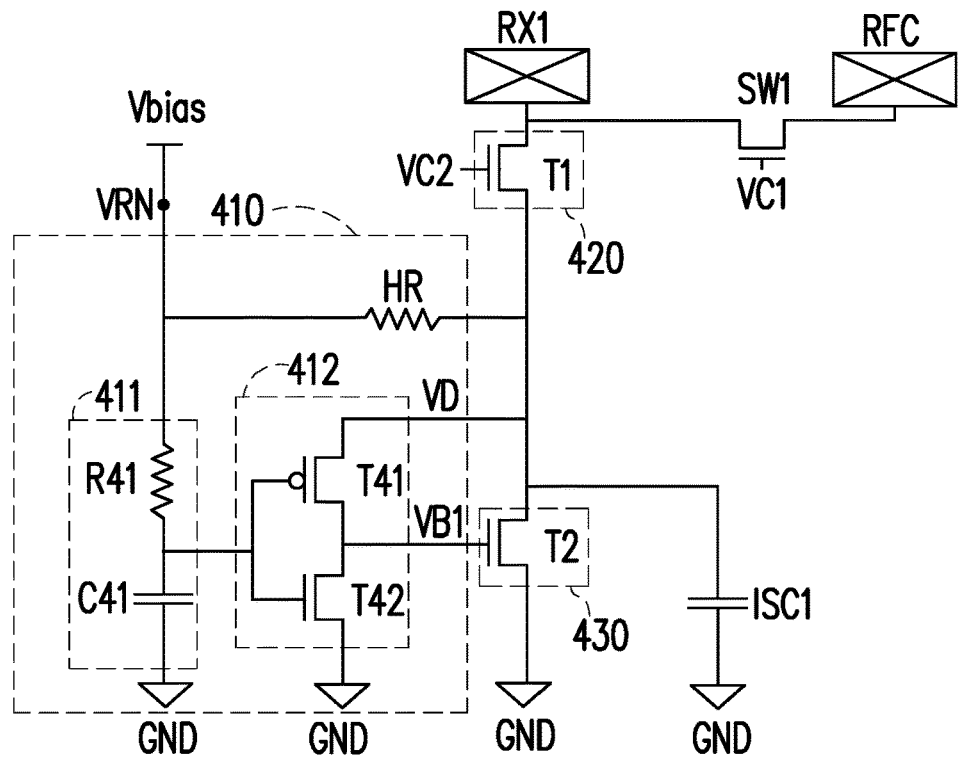
FIG. 4 is a schematic view of a signal switching apparatus according to another embodiment of the disclosure.

Referring to FIG. 4, FIG. 4 is a schematic view of a signal switching apparatus according to another embodiment of the disclosure. A signal switching apparatus 400 includes a switch SW1, a switch circuit 420, a blocking capacitor ISC1, a SCD-circuit 430 and a bias voltage generator 410. In the embodiment, the coupling method and the operation principle of the switch SW1, the switch circuit 420, the blocking capacitor ISC1 and the SCD-circuit 430 are respectively similar to the switch SW1, the switch circuit 110, the blocking capacitor ISC1 and the SCD-circuit 120 in FIG. 1, and thus the related descriptions are omitted hereinafter.

The bias voltage generator 410 includes a delay circuit 411, an inverter 412, and a resistor HR. The inverter 412 is constituted by transistors T41 and T42, different from the signal switching apparatus 300 in the foregoing embodiment, the transistor T41 of the inverter 412 receives the operation voltage VD through being coupled to the end point that is coupled to the transistor T1 and the transistor T2. In other words, the operation voltage VD is supplied to the power end of the inverter 412. Further, the delay circuit 411 is constituted by the resistor R41 and the capacitor C41, wherein the inner node that is coupled to the resistor R41 and the capacitor C41 generates the signal ST. The first end of the resistor R41 is coupled to the voltage receiving end VRN, and configured to receive a bias voltage Vbias, the second end of the resistor R41 is coupled to the first end of the capacitor C41 and the inner node, and the second end of the capacitor C41 is coupled to the voltage terminal GND. Moreover, the second end of the resistor R41 and the first end of the capacitor C41 are coupled to the inner node and the input end of the inverter 412 together. The first end of the resistor R41 is coupled to the first end of the resistor HR, the second end of the resistor HR is coupled between the second end of the switch circuit 420 and the first end of the transistor T2, and configured to provide the bias voltage Vbias to the transistor T1 and blocks the RF signal in the serial connection path from being leaked to the voltage receiving end VRN. In an embodiment, the resistance of the resistor HR is about 100 kΩ or more. In another embodiment, the second end of the resistor HR may be coupled to any end point on the serial connection path of the switch circuit 420, such as a first end or a second end of the switch circuit 420, or a first end or a second end of the transistor T1 in the switch circuit 420. In another embodiment, the switch circuit 420 may include a plurality of transistors T1 like the switch circuit 310 and coupled in series between the end RX1 and the first end of the blocking capacitor ISC1.

When the surge current occurs, the delay circuit 411 provides a low voltage level that is maintained for at least a certain period of time to the inner node coupled to the resistor R41 and the capacitor C41, such that the output end of the inverter 412 generates the bias voltage VB1 with a voltage level approximately equal to the voltage level of the operation voltage VD, and turns on the transistor T2 according to the bias voltage VB1. In this manner, the surge current may be dissipated through the transistor T2 that is turned on, thereby effectively protecting the circuit element from being damaged by the surge current.

Relatively, in the state that the signal switching apparatus 400 is operated normally (no surge current is generated), the delay circuit 411 provides the signal that is substantially equal to the level of bias voltage Vbias to the input end of the inverter 412, such that the inverter 412 generates the bias voltage VB1 that is substantially equal to the level of the voltage terminal GND, and allows the transistor T2 to be maintained in the turn-off state according to the bias voltage VB1.

It should be mentioned that a voltage level of the bias voltage Vbias may be different from the voltage level of the reference voltage VCC in the foregoing embodiment. In an embodiment of the disclosure, the voltage level of the bias voltage Vbias may be smaller than the voltage level of the reference voltage VCC. In another embodiment, the voltage level of the bias voltage Vbias may be changed depending on the on or off state of the switch circuit 420 so that the high frequency operation characteristic of the signal switching apparatus 400 can be optimized.

Figure 5A:
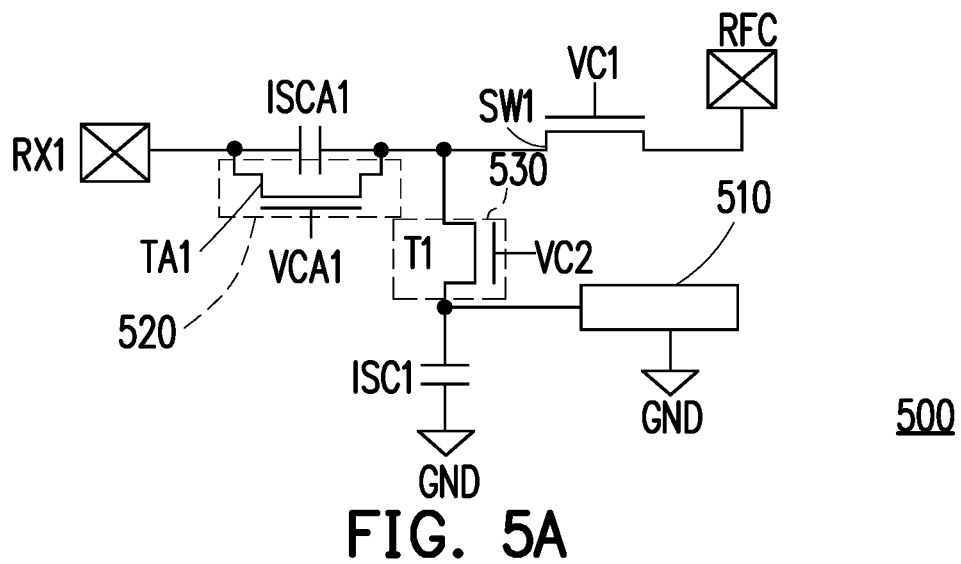
FIG. 5A and FIG. 5B are schematic views of a signal switching apparatus according to different embodiments of the disclosure.
Figure 5B:
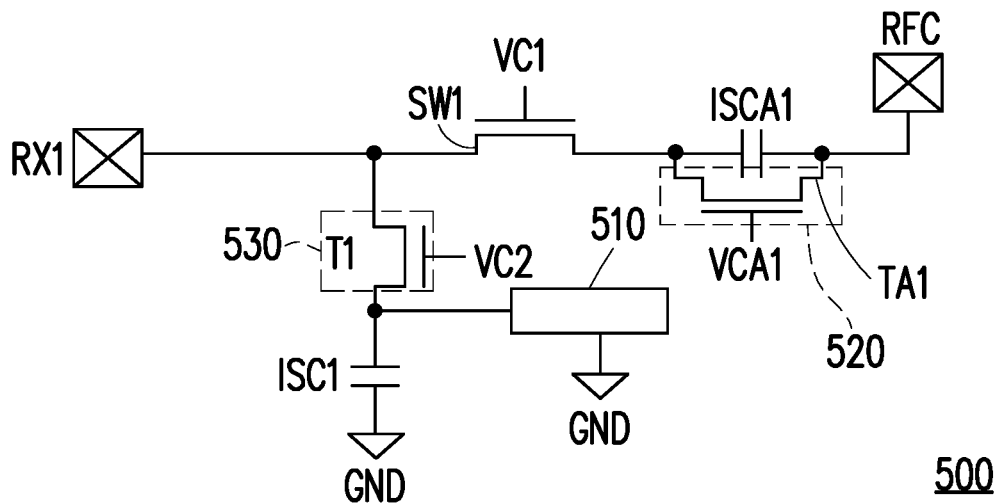

Referring to FIG. 5A and FIG. 5B, are schematic views of a signal switching apparatus according to different embodiments of the disclosure. In FIG. 5A and FIG. 5B, the coupling method and the operation principle of the switch SW1, the switch circuit 530, the blocking capacitor ISC1 and the SCD-circuit 510 are respectively similar to the switch SW1, the switch circuit 110, the blocking capacitor ISC1 and the SCD-circuit 120 in FIG. 1, and thus the related descriptions are omitted hereinafter. In FIG. 5A, a signal switching apparatus 500 further includes a blocking capacitor ISCA1 and a SCD-circuit 520. The blocking capacitor ISCA1 and the switch SW1 are connected in series between the end RX1 and the signal transceiving end RFC. One end of the blocking capacitor ISCA1 is coupled to the end RX1, another end of the blocking capacitor ISCA1 is coupled to the first end of the switch SW1, such that the switch SW1 is indirectly coupled to the end RX1 through the blocking capacitor ISCA1. The first end of the SCD-circuit 520 is coupled between one end of the blocking capacitor ISCA1 and the end RX1. The second end of the SCD-circuit 520 is coupled between another end of the blocking capacitor ISCA1 and the switch SW1. The SCD-circuit 520 has a transistor TA1, the first end and the second of the SCD-circuit 520 are respectively coupled to the first end and the second end of the transistor TA1. In other words, the SCD-circuit 520 and the transistor TA1 thereof are coupled to the blocking capacitor ISCA1 in parallel. The control end of the transistor TA1 receives the bias voltage VCA1, and is maintained in the turn-off state according to the bias voltage VCA1 when the signal switching apparatus 500 is operating normally. Similar to the bias voltage VB1 in the foregoing embodiments, the bias voltage VCA1 may be generated by the bias voltage generator 210, 320 or 410.

When the surge current is occurred on the signal switching apparatus 500 (e.g., occurred on the end RX1), the transistor TA1 may be turned on corresponding to the surge current. Similar to the SCD-circuit 120 in the foregoing embodiment, the SCD-circuit 520 may generate a dissipating path that is substantially parallel with the surge current of the blocking capacitor ISCA1, thereby effectively dissipating the surge current and achieving the effect of protecting the circuit element.

It should be mentioned that, in the embodiment of the disclosure, the transistors T1 and TA1 may be both enhancement transistors or depletion transistors. In another embodiment of the disclosure, the transistors T1 and TA1 may be both n-type transistors or p-type transistors.

Referring to FIG. 5B, the main difference between FIG. 5B and FIG. 5A is that one end of the blocking capacitor ISCA1 is coupled to the end RFC, and another end of the blocking capacitor ISCA1 is coupled to the end RX1 through the switch SW1, such that the switch SW1 is indirectly coupled to the end RFC through the blocking capacitor ISCA1. The blocking capacitor ISCA1 and the SCD-circuit 520 coupled thereto in parallel are connected in series between the switch SW1 and the end RFC. When the surge current is occurred on the signal switching apparatus 500 (e.g., occurred on the end RFC), the transistor TA1 may be turned on corresponding to the surge current, thereby effectively dissipating the surge current and archiving the effect of protecting the circuit element.

Figure 6:
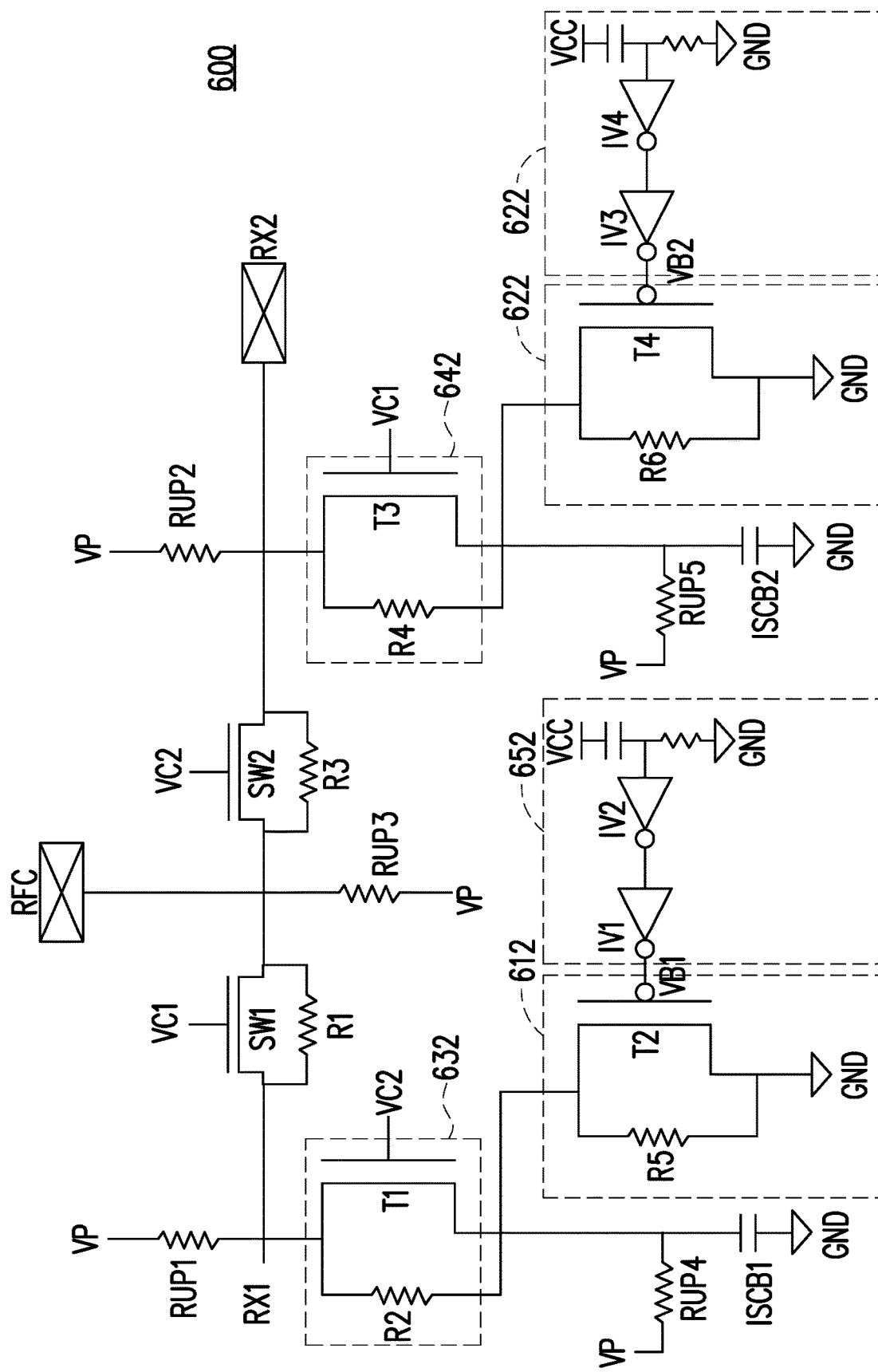
FIG. 6 is a schematic view of a signal switching apparatus according to yet another embodiment of the disclosure.

Referring to FIG. 6, is a schematic view of a signal switching apparatus according to yet another embodiment of the disclosure. A signal switching apparatus 600 may be configured to transceive a high-frequency signal such as a RF signal. The signal switching apparatus 600 includes signal control switches SW1 and SW2, switch circuits 632 and 642, blocking capacitors ISCB1 and ISCB2 and SCD-circuits 612 and 622. In the embodiment, the coupling method and the operation principle of the ends RX1 and RFC, the switch SW1, the switch circuit 632, the blocking capacitor ISCB1 and the SCD-circuit 612 are respectively similar to the ends RX1 and RFC, the switch SW1, the switch circuit 110, the blocking capacitor ISC1 and the SCD-circuit 120 in FIG. 1. Meanwhile, the coupling method and operation principle of the ends RX2 and RFC, the signal control switch SW2, the switch circuit 642, the blocking capacitor ISCB2 and the SCD-circuit 622 are respectively similar to the ends RX1 and RFC, the switch SW1, the switch circuit 110, the blocking capacitor ISC1 and the SCD-circuit 120 in FIG. 1. The switch SW1 is coupled between the ends RX1 and RFC, and is turned on or off according to the control signal VC1. The signal control switch SW2 is coupled between the ends RFC and RX2, and is turned on or off according to the control signal VC2. The switch circuit 632 and the capacitor ISCB1 are connected in series between the end RX1 and the voltage terminal GND in sequence. The transistor T1 of the switch circuit 632 is controlled by the control signal (e.g., may be control signal VC2) to be turned on or off. A transistor T3 of the switch circuit 642 and the capacitor ISCB2 are connected in series between the signal transceiving end RX2 and the voltage terminal GND in sequence. The transistor T3 of the switch circuit 642 is controlled by the control signal (e.g., may be control signal VC1) to be turned on or off. Specifically, the on or off states of the switch SW1 and the transistor T3 may be the same, the on or off states of the signal control switch SW2 and the transistor T1 may be the same, and the on or off states of the signal control switches SW1 and SW2 may be complementary.

When the switch SW1 is turned on, the ends RX1 and RFC may transceive high-frequency signal. Meanwhile, the signal control switch SW2 and the transistor T1 are turned off simultaneously to prevent the signal on the transceiving path of the ends RX1 and RFC from being interfered by the signal on the end RX2. Further, the transistor T3 is turned on such that the end RX2 is coupled to the voltage terminal GND, and thus it is possible to avoid the signal on the end RX2 from interfering with the signal on the transceiving path of the ends RX1 and RFC.

In the embodiment, the signal switching apparatus 600 may further include bias resistors RUP1-RUP5 respectively coupled between the ends RX1, RX2 as well as RFC and voltage level VP, and configured to bias the ends RX1, RX2 and RFC to the voltage level VP. Additionally, bias resistors RUP4-RUP5 are respectively coupled between the second end of the transistors T1 and T3 and the voltage level VP, thereby biasing the second end of the transistors T1 and T3 to the voltage level VP.

The signal switching apparatus 600 may further include bias voltage generators 652 and 662. The bias voltage generator 652 includes inverters IV1 and IV2 coupled in series. The input end of the inverter IV2 is coupled to the reference voltage terminal through a resistor to receive the reference voltage VCC, and coupled to the voltage terminal GND through a capacitor. The output end of the inverter IV1 provides the bias voltage VB1 to the control end of the transistor T2, and allows the transistor T2 to be maintained in the turn-off state in the absence of the surge current (e.g., when signal switching apparatus 600 is operated normally). The bias voltage generator 662 includes inverters IV3 and IV4, and the coupling method and the operation principle thereof are similar to the inverters IV1 and IV2, and thus related descriptions are omitted hereinafter.

Additionally, in the embodiment, the switches SW1 and SW2 as well as transistors T1-T4 may be respectively coupled to the resistors R1, R3, R2, R5, R4 and R6 in parallel. Moreover, in the embodiment, the resistors R1-R6 may be bypass resistors, and the transistors T1-T4 may be all enhancement transistors or depletion transistors.

In other embodiments, the bias voltage generator 210 in FIG. 2B-FIG. 2G, the bias voltage generator 320 in FIG. 3 and the bias voltage generator 410 in FIG. 4 may also be used to generate the bias voltage VB1 or VB2.

In summary, the signal switching apparatus in the disclosure provides the SCD-circuit that is coupled to the blocking capacitor in parallel. Also, the transistor in the SCD-circuit is maintained in the turn-off state in the normal state according to the bias voltage that is received. In this manner, when surge current is generated on the signal switching apparatus, the transistor in the SCD-circuit can be turned on and provides a channel for dissipating the surge current.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A signal switching apparatus, comprising:
 a first signal control switch, coupled between a first signal transceiving end and a second signal transceiving end, configured to be turned on or off according to a first control signal;
 a first switch circuit, having at least one first transistor, a first end of the first switch circuit coupled between the first signal transceiving end and the first signal control switch, the first switch circuit controlled by a second control signal to be turned on or off;
 a first blocking capacitor, coupled between a second end of the first switch circuit and a reference voltage terminal; and
 a first surge current dissipating circuit, having at least one second transistor, the first surge current dissipating circuit coupled between a second end of the first switch circuit and the reference voltage terminal, the at least one second transistor configured to dissipate a surge current when the surge current is generated and also turned off according to a first bias voltage when the signal switching apparatus is operated normally,
 wherein the first surge current dissipating circuit further comprises:
 a first bias voltage generator, coupled to a control end of the at least one second transistor and configured to generate the first bias voltage;
 wherein the first bias voltage generator comprises:
 at least one inverter, connected in series between a control end of the at least one second transistor and an inner node; and
 a delay circuit, coupled to the inner node;
 wherein the delay circuit is configured to provide a low voltage level maintained for at least a certain period of time to the inner node when the surge current is generated, and provide an input voltage to the inner node according to a reference voltage to generate the first bias voltage when the signal switching apparatus is operated normally;
 or the first bias voltage generator comprises:
 a first resistor, one end thereof coupled to a control end of the at least one second transistor, and another end thereof coupled to the reference voltage terminal or a reference voltage receiving end, said another end of the first resistor is coupled to the reference voltage terminal, a first end of the at least one second transistor is coupled to a second end of the first switch circuit, a second end of the at least one second transistor is coupled to the reference voltage terminal; and
 a first capacitor, one end thereof coupled to a control end of the at least one second transistor, and another end thereof coupled to a first end of the at least one second transistor;
 or the first bias voltage generator comprises
 an inverter, having a power end, configured to receive an operation voltage; an input end; and an output end, coupled to a control end of the at least one second transistor; and
 a delay circuit, coupled to an input end of the inverter, configured to provide a low voltage level maintained for at least a certain period of time when the surge current is generated such that a voltage level of an output end of the inverter is approximately equal to a voltage level of the operation voltage.

2. The signal switching apparatus as claimed in claim 1, wherein the at least one first transistor and the at least one second transistor are both enhancement transistors or both depletion transistors.

3. The signal switching apparatus as claimed in claim 1, wherein when the signal switching apparatus is operated normally, on or off states of the first signal control switch and the first switch circuit are opposite.

4. The signal switching apparatus as claimed in claim 1, wherein when a number of the at least one first transistor is plural, the first transistors are connected in series between the first signal transceiving end and the first blocking capacitor, control ends of the first transistors receive the second control signal together.

5. The signal switching apparatus as claimed in claim 1, wherein the delay circuit comprises a second resistor and a second capacitor connected in series between a reference voltage receiving end and the reference voltage terminal in sequence, and the inner node is coupled between the second resistor and the second capacitor.

6. The signal switching apparatus as claimed in claim 1, wherein the first bias voltage generator comprises:
    a transmitting wire, one end thereof connected to a control end of the at least one second transistor, and another end thereof connected to the reference voltage terminal or a reference voltage receiving end.

7. The signal switching apparatus as claimed in claim 1, wherein the first bias voltage generator further comprises:
    a turn-on voltage controller, coupled to the first signal transceiving end, generating the operation voltage according to a voltage on the first signal transceiving end.

8. The signal switching apparatus as claimed in claim 7, wherein the turn-on voltage controller comprises:
    N diodes connected in series, wherein an anode of a first diode is coupled to a first end or a second end of the at least one first transistor, a cathode of Nth diode is coupled to a power end of the inverter.

9. The signal switching apparatus as claimed in claim 1, wherein the delay circuit comprises a second resistor and a second capacitor connected in series between a voltage receiving end and the reference voltage terminal in sequence.

10. The signal switching apparatus as claimed in claim 1, wherein a first end of the at least one second transistor is coupled to a second end of the first switch circuit, a second end of the at least one second transistor is coupled to the reference voltage terminal, and a power end of the inverter is coupled to a first end of the at least one second transistor, the first bias voltage generator further comprises:
    a second resistor, connected in series between a voltage receiving end and a first end of the at least one first transistor, and connected in series between the voltage receiving end and a second end of the at least one first transistor.

11. The signal switching apparatus as claimed in claim 10, wherein the voltage receiving end is configured to receive a bias voltage, and a voltage level of the bias voltage is changed according to the on or off state of the first switch circuit.

12. A signal switching apparatus, comprising:
    a first signal control switch, coupled between the first signal transceiving end and the second signal transceiving end, configured to be turned on or off according to a first control signal; a first switch circuit, having at least one first transistor, a first end of the first switch circuit coupled between the first signal transceiving end and the first signal control switch, the first switch circuit controlled by a second control signal to be turned on or off;
    a first blocking capacitor, coupled in series with the first signal control switch between the first signal transceiving end and the second signal transceiving end, and configured to make the first signal control switch to be coupled to one of the first signal transceiving end and the second signal transceiving end through the first blocking capacitor;
    a second blocking capacitor, coupled between a second end of the first switch circuit and a reference voltage terminal; and
    a first surge current dissipating circuit, having at least one second transistor, the first surge current dissipating circuit having a first end and a second end respectively coupled to a first end and a second end of the first blocking capacitor, the second transistor configured to dissipate a surge current when the surge current is generated, and the second transistor configured to turn off according to the first bias voltage when the signal switching apparatus is operated normally
    wherein the first surge current dissipating circuit further comprises:
        a first bias voltage generator, coupled to a control end of the at least one second transistor and configured to generate the first bias voltage;
    wherein the first bias voltage generator comprises:
        at least one inverter, connected in series between a control end of the at least one second transistor and an inner node; and
        a delay circuit, coupled to the inner node;
            wherein the delay circuit is configured to provide a low voltage level maintained for at least a certain period of time to the inner node when the surge current is generated, and provide an input voltage to the inner node according to a reference voltage to generate the first bias voltage when the signal switching apparatus is operated normally;
    or the first bias voltage generator comprises:
        a first resistor, one end thereof coupled to a control end of the at least one second transistor, and another end thereof coupled to the reference voltage terminal or a reference voltage receiving end, said another end of the first resistor is coupled to the reference voltage terminal, a first end of the at least one second transistor is coupled to a second end of the first switch circuit, a second end of the at least one second transistor is coupled to the reference voltage terminal; and
        a first capacitor, one end thereof coupled to a control end of the at least one second transistor, and another end thereof coupled to a first end of the at least one second transistor;
    or the first bias voltage generator comprises
        an inverter, having a power end, configured to receive an operation voltage; an input end; and an output end, coupled to a control end of the at least one second transistor; and
        a delay circuit, coupled to an input end of the inverter, configured to provide a low voltage level maintained for at least a certain period of time when the surge current is generated such that a voltage level of an output end of the inverter is approximately equal to a voltage level of the operation voltage.

13. The signal switching apparatus as claimed in claim 12, further comprising:
    a second surge current dissipating circuit, having at least one third transistor, the second surge current dissipating circuit coupled between a second end of the first switch circuit and the reference voltage terminal, the at least one third transistor is configured to dissipate the surge current when the surge current is generated, and also turned off according to a second bias voltage when the signal switching apparatus is operated normally.

14. A signal switching apparatus, comprising:
a first signal control switch, coupled between a first signal transceiving end and a second signal transceiving end, and configured to be turned on or off according to a first control signal;
a first switch circuit, having at least one first transistor, a first end of the first switch circuit coupled between the first signal transceiving end and the first signal control switch, the first switch circuit controlled by a second control signal to be turned on or off;
a first blocking capacitor, coupled between a second end of the first switch circuit and a reference voltage terminal;
a first surge current dissipating circuit, having at least one second transistor, the first surge current dissipating circuit coupled between a second end of the first switch circuit and the reference voltage terminal, the at least one second transistor configured to dissipate a surge current when the surge current is generated, and also turned off according to a first bias voltage when the signal switching apparatus is operated normally;
a second signal control switch, coupled between a third signal transceiving end and the second signal transceiving end, configured to be turned on or off according to a third control signal;
a second switch circuit, having at least one third transistor, a first end of the second switch circuit coupled between the third signal transceiving end the second signal control switch, the second switch circuit controlled by a fourth control signal to be turned on or off;
a second blocking capacitor, coupled between a second end of the second switch circuit and the reference voltage terminal; and
a second surge current dissipating circuit, having at least one fourth transistor, the second surge current dissipating circuit coupled between a second end of the second switch circuit and the reference voltage terminal, the at least one fourth transistor configured to dissipate the surge current when the surge current is generated, and also turned off according to a second bias voltage when the signal switching apparatus is operated normally,
wherein the first surge current dissipating circuit further comprises:
a first bias voltage generator, coupled to a control end of the at least one second transistor and configured to generate the first bias voltage;

wherein the first bias voltage generator comprises:
at least one inverter, connected in series between a control end of the at least one second transistor and an inner node; and
a delay circuit, coupled to the inner node;
wherein the delay circuit is configured to provide a low voltage level maintained for at least a certain period of time to the inner node when the surge current is generated, and provide an input voltage to the inner node according to a reference voltage to generate the first bias voltage when the signal switching apparatus is operated normally;
or the first bias voltage generator comprises:
a first resistor, one end thereof coupled to a control end of the at least one second transistor, and another end thereof coupled to the reference voltage terminal or a reference voltage receiving end, said another end of the first resistor is coupled to the reference voltage terminal, a first end of the at least one second transistor is coupled to a second end of the first switch circuit, a second end of the at least one second transistor is coupled to the reference voltage terminal; and
a first capacitor, one end thereof coupled to a control end of the at least one second transistor, and another end thereof coupled to a first end of the at least one second transistor;
or the first bias voltage generator comprises
an inverter, having a power end, configured to receive an operation voltage; an input end; and an output end, coupled to a control end of the at least one second transistor; and
a delay circuit, coupled to an input end of the inverter, configured to provide a low voltage level maintained for at least a certain period of time when the surge current is generated such that a voltage level of an output end of the inverter is approximately equal to a voltage level of the operation voltage.

15. The signal switching apparatus as claimed in claim 14, wherein the at least one first transistor, the at least one second transistor, the at least one third transistor and the at least one fourth transistor are all enhancement transistors or all depletion transistors.

\* \* \* \* \*